United States Patent [19]

Youn

[11] Patent Number: 5,043,672
[45] Date of Patent: Aug. 27, 1991

[54] POWER DETECTOR UTILIZING BIAS VOLTAGE DIVIDER FOR PRECISION CONTROL OF AN AMPLIFIER

[75] Inventor: Tai W. Youn, Calgary, Canada

[73] Assignee: NovAtel Communications Ltd., Calgary, Canada

[21] Appl. No.: 499,064

[22] Filed: Mar. 26, 1990

[51] Int. Cl.[5] .............................................. H03G 3/00
[52] U.S. Cl. .................................... 330/129; 330/279
[58] Field of Search ............... 330/129, 138, 279, 280; 455/116, 126

[56] References Cited

U.S. PATENT DOCUMENTS

| | | | |
|---|---|---|---|
| 4,523,155 | 6/1985 | Walczak et al. | 330/279 |
| 4,546,326 | 10/1985 | Van Uffelen et al. | 330/275 X |
| 4,602,218 | 7/1986 | Vilmur et al. | 330/279 |
| 4,760,347 | 7/1988 | Li et al. | 330/127 |

OTHER PUBLICATIONS

"8656A Signal Generator Operating and Service Manual", Hewlett-Packard Company, Palo Alto, California (May 1981), pp. 8-35a-c, 8-57a-c.
"Advanced Mobile Phone System", High Capacity Mobile Radio Telephone, Manual No. 68P81039825 A Motorola, Inc.

Primary Examiner—James B. Mullins
Attorney, Agent, or Firm—Cesari & McKenna

[57] ABSTRACT

A controlled-output amplifier circuit whose output power may be maintained at a number of predetermined levels over a wide ambient temperature range. The amplifier includes a controllable gain amplifier stage, and a power level detector consisting of a detector diode and a linear voltage divider. The linear voltage divider is preferably composed of two resistors, with a first resistor being connected in series between a direct current (DC) voltage and the anode of the diode, and a second resistor connected between the cathode of the diode and a ground reference point. Preferably, the resistance of the first resistor is much greater than that of the second resistor. This insures that the detector bias voltage is sufficiently small so that any effects of variation in temperature are attenuated to an acceptably small level. Additionally, the first and second resistors have temperature coefficients such that the effect of the rate of change of the forward voltage drop of the detector diode with respect to temperature is reduced by the ratio of the resistance of the second resistor to that of the first resistor.

13 Claims, 1 Drawing Sheet

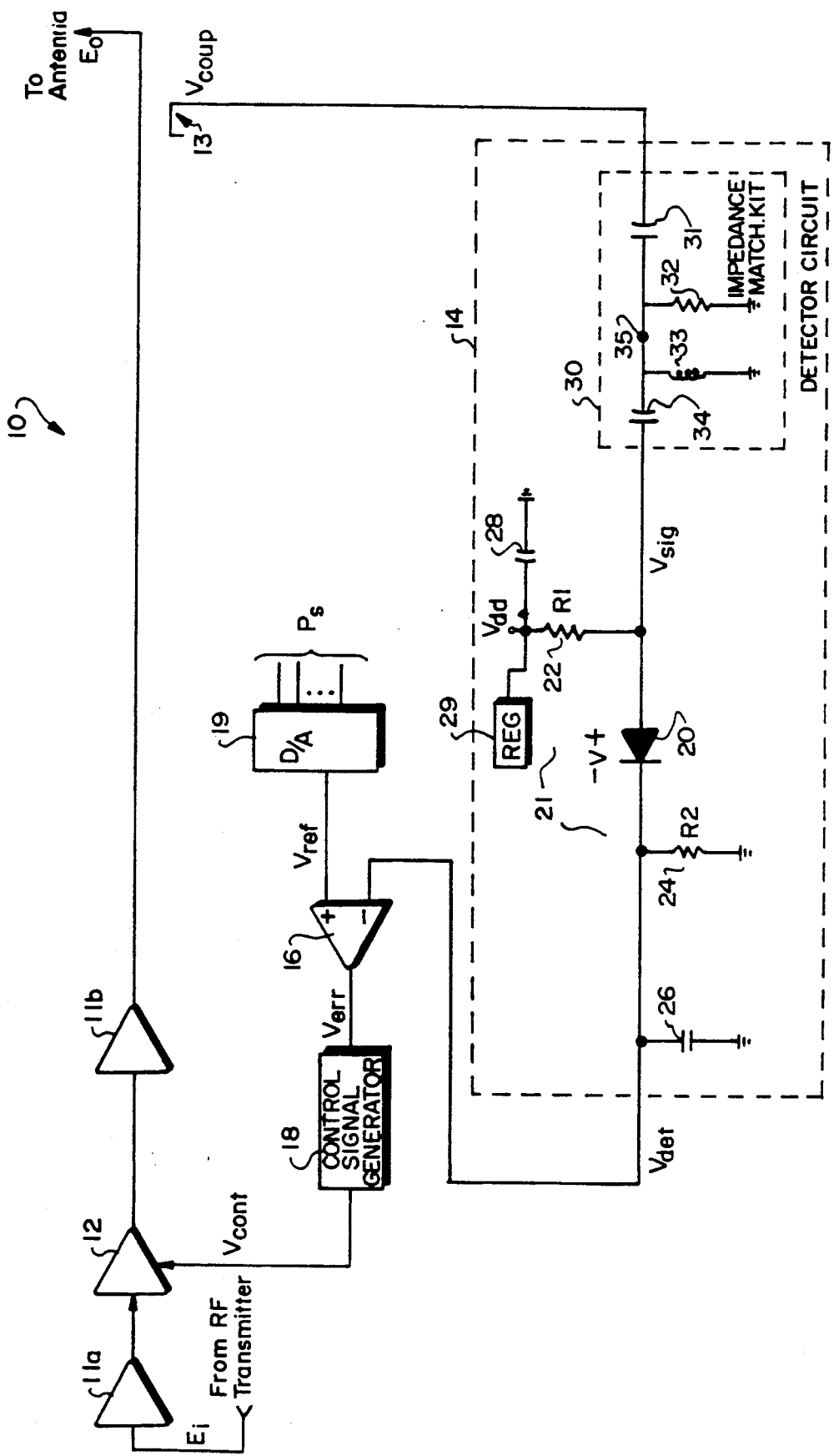

POWER DETECTOR UTILIZING BIAS VOLTAGE DIVIDER FOR PRECISION CONTROL OF AN AMPLIFIER

FIELD OF THE INVENTION

This invention relates generally to a controlled-output amplifier whose output power level may be set to any of a number of predetermined levels. More specifically, it relates to a controlled-output amplifier which uses a power level detector biased by a linear voltage divider.

BACKGROUND OF THE INVENTION

Most modern radio transmitters must precisely control their radiated radio frequency (RF) output power to within a certain predetermined limit. This requirement is especially important in the design of cellular radio telephone and similar transmitters which must provide several output power levels within certain tolerances over a wide range of operating temperatures.

A typical controlled-output amplifier circuit known in the prior art uses a controllable-gain amplifier stage arranged in a feedback loop. The output power level of the amplifier stage is determined typically by using a detector diode and a capacitor to form a half wave rectifier. The detector output signal is then compared to a reference voltage to develop an error signal which is fed back to control the gain of the amplifier stage, and thus to maintain the output power level.

Unfortunately, most present-day detector diodes possess characteristics which may produce adverse operational effects in certain applications. For example, the forward voltage drop of a detector diode is highly temperature-dependent; it usually varies on the order of several milli-volts per degree centigrade (mV/°C.). If the application calls for a relatively low output power level (on the order of 100 milliwatts (mW) or less), then the temperature dependence of the forward voltage drop of the diode will be fairly large in comparison. Thus, the variations in forward voltage drop with temperature over a range of operating temperatures will often introduce significant errors in the detector output signal.

A conventional solution to minimizing the effect of temperature drift in the forward voltage drop of the detector diode is to use some form of temperature compensation. In one embodiment of this technique, such as that disclosed in Walczak, et al. U.S. Pat. No. 4,523,155, on June 11, 1985, and assigned to Motorola, Incorporated, a second, compensation diode is arranged to bias the detector diode at a conduction threshold. If the detector diode and compensation diode have "matched" temperature characteristics, their forward voltage drops track one another as the temperature varies, and thus the detector diode remains biased at a constant conduction threshold voltage which remains constant with temperature.

A second problem arises due to the fact that the peak voltage of the RF signal output by the amplifier stage must be limited to a narrow range in order to prevent the diode from being reverse-biased or driven into saturation. Thus, the amplifier circuit must be operated over a limited dynamic range. U.S. Pat. No. 4,602,218, issued to Vilmur, et al. on July 22, 1986, and assigned to Motorola, Incorporated, discloses one technique for addressing this problem, wherein a logarithmic or some other type of non-linear amplifier is inserted between the amplifier stage and the detector diode. The non-linear amplifier substantially compresses the dynamic range of the amplifier output signal, which, in turn, has the effect of increasing the range of amplifier output voltages over which the detector diode exhibits acceptable characteristics.

Yet another solution to both of the aforementioned problems is disclosed in U.S. Pat. No. 4,760,347, issued to Li. et al. on July 26, 1988, and assigned to NovAtel Communications, Ltd., the assignee of the present application. In that technique, the detector diode may be biased to any one of a number of pre-selected bias states in accordance with changes in the desired output power level. This technique has the dual advantage of eliminating the need for a second temperature compensating diode as well as increasing the available dynamic range.

While these techniques work for their intended purpose, they do not solve the aforementioned problems entirely. For example, the temperature compensation diode approach requires a set of expensive matched diodes. Similarly, the non-linear amplifier approach requires matched components such as a differential transistor pair. And the bias control approach requires a fairly complicated circuit to change the detector bias to a number of different levels in accordance with the desired output power level.

SUMMARY OF THE INVENTION

Briefly, the invention is a controlled-output amplifier circuit wherein the output power may be maintained at a number of predetermined levels over a wide ambient temperature range. The amplifier circuit includes a controllable gain amplifier stage, and a power level detector consisting of a detector diode and a linear voltage divider. The voltage divider is preferably composed of two resistors, with a first resistor connected in series between a direct current (DC) bias voltage and the anode of the diode, and a second resistor connected between the cathode of the diode and a ground reference voltage.

Preferably, the resistance of the first resistor is much greater than that of the second resistor. This insures that the detector output voltage is sufficiently small so that any effects of variation in temperature are likewise attenuated to an acceptably small level.

Additionally, the first and second resistors preferably have similar temperature coefficients so that the rate of change of the detector output signal with respect to temperature is reduced by the ratio of the resistance of the second resistor to that of the first resistor.

An input impedance matching circuit may be disposed between the amplifier and the anode of the detector diode to assist in keeping the operation of the circuit stable.

There are several advantages to this amplifier circuit. It is simple, inexpensive, and uses a minimum number of conventional circuit components, while exhibiting stable operation over a wide range of temperatures. Since only a single diode is used the available dynamic range of the circuit is easily controlled.

BRIEF DESCRIPTION OF THE DRAWING

The single drawing FIGURE is a schematic diagram of a controlled-output power amplifier circuit in accordance with the invention.

DETAILED DESCRIPTION OF AN ILLUSTRATIVE EMBODIMENT

Referring now to the drawing, there is shown a controlled output amplifier circuit 10 including a controllable-gain amplifier stage 12 having a feedback or servo loop which maintains the output power level of the amplifier stage 12 at a substantially constant, predetermined level. The feedback loop includes a directional coupler 13, a detector circuit 14, a comparator 16, and a control signal generator 18. The amplifier stage 12, comparator 16, and control signal generator 18 are of conventional construction and known in the art. The present invention is in the design and operation of the detector circuit 14. In order to understand the invention, however, a general description of the arrangement of the feedback loop and the signals generated therein is first necessary.

An input radio frequency (RF) signal $E_i$, such as that generated by RF transmitter circuits (not shown), is applied to an input terminal of the amplifier stage 12. An output signal $E_0$ is fed from the amplifier stage 12 to further transmitter components such as an antenna or RF filter (not shown). Additional stages 11a and 11b may optionally be cascaded before or after amplifier stage 12.

A directional coupler 13 is disposed in the RF signal output path between the amplifier stage 12 and the antenna. It provides a signal, $V_{coup}$, which is a sample (or portion) of the RF output signal $E_0$ to an input terminal of the detector 14. Other types of RF signal sampling components, such as a capacitor, may be used in place of the directional coupler 13.

The output signal $V_{det}$ from the detector 14 is a rectified direct current (DC) signal having a magnitude which is related to the magnitude of he amplifier output signal $E_0$. The output signal $V_{det}$ is provided to an inverting input terminal of the comparator 16; a reference signal $V_{ref}$ is provided to the other, non-inverting input terminal. The comparator 16 thus compares the detector output signal $V_{det}$ to the reference signal $V_{ref}$ and produces an error signal $V_{err}$ indicative of the difference in their magnitudes.

The output terminal of the comparator 16 is connected to the input terminal of the control signal generator 18, and the control signal generator 18 is connected to the controllable-gain amplifier stage 12 to complete the feedback loop. In response to the error signal $V_{err}$, the control signal generator 18 produces a control signal $V_{cont}$ which causes the gain of the amplifier stage 12 to either increase or decrease in order to reduce the magnitude of the error signal $V_{err}$. The output power of the amplifier stage 12 is thus maintained at a substantially constant level.

Conventional circuitry such as a digital-to-analog (D/A) converter 19 may be used to provide a plurality of reference signals similar to $V_{ref}$ in response to digital power level select signals $P_s$. This permits the amplifier 12 to operate at any of a number predetermined power levels. For example, in a conventional cellular mobile telephone transceiver intended for use in North America, $V_{ref}$ may assume any one of eight different voltages. Additional conventional circuitry such as a microprocessor (not shown) is typically used to provide the digital power level select signals $P_s$.

Now considering the invention more particularly, in its simplest form the detector circuit 14 includes a rectifying detector diode 20 and a linear voltage divider 21.

The linear voltage divider 21 preferably consists of two resistors, with a first resistor 22 connected between a DC bias voltage terminal $V_{dd}$ and the anode of the diode 20, and a second resistor 24 connected between the cathode of the diode 20 and a ground reference terminal. The cathode of the diode 20 provides the output signal from detector 14; the anode of the diode 20 receives the output signal $E_0$ from the amplifier stage 12. The detector diode 20 is preferably a Schottky-type diode such as the model BAT 17 available from Philips Industries, Groenewoudsewegl, 5621 BA, Eindhoven, The Netherlands.

The voltage divider 21 voltage-divides the bias voltage $V_{dd}$ and thus effectively reduces the operating voltage variance of the diode 20 so that no specific temperature compensation circuits are needed in order for the detector 14 to operate properly over a wide range of temperatures. This in turn has the effect of reducing the temperature dependency of the detector output signal $V_{det}$. I have discovered that for the embodiment shown, if the resistance R1 of the first resistor 22 is sufficiently greater than the resistance R2 of the second resistor 24, then the magnitude of the reduction in temperature dependency of the detector output signal $V_{det}$ is approximately the same as the ratio of the two resistances, namely R2/R1.

For example, the preferred Philips BAT 17 diode has a nominal forward voltage drop V of 276 mV at 25° C., which varies over a temperature range of −30° C. to +80° C. from 205 mV to 348 mV, or a total of 143 mV. However, in the case of the invention, if the resistance ratio R2/R1 is chosen to be 1:5, and resistance magnitudes and bias voltage $V_{dd}$ are chosen such that the detector output signal $V_{det}$ is one volt with a zero-volt detector input signal $V_{sig}$ at 25° C., then the voltage drop V will only vary from 264 mV to 288 mV over a −30° C. to +80° C. temperature range, for a total variation of 24 mV. This is approximately 5–6 times less than the nominal range of diode forward voltage drop V with temperature.

Therefore, in an ideal theoretical sense, the diode forward voltage drop V can be made arbitrarily small, and hence, so can any temperature-induced variation thereof, by appropriately choosing R2 and R1. In practice, however, the ratio R2/R1 is limited by two requirements. First, the diode 20 must always remain forward biased by an amount greater than the largest expected peak voltage of the signal $E_0$, to avoid reverse-biasing the diode 20. Secondly, the smallest expected amplitude of the signal $V_{coup}$ must be sufficient to cause a detector input signal $V_{sig}$ large enough to forward-bias the detector diode 20, and thereby generate an output signal $V_{det}$ which is large enough to drive the input terminal of the comparator 16.

The bias voltage $V_{dd}$ need only be regulated to about ±5% over the range of operating temperatures. This is easily realizable with present-day standard power supplies. $V_{dd}$ is preferably provided by one of the available supply voltages for the components of the amplifier circuit 10, such as the supply voltage for the comparator 16 and D/A converter 19. A separate voltage regulator 29 may be provided if desired.

Thus, unlike other approaches, since the resistors 22 and reduce the variation in the detector output voltage provided by the diode 20, no temperature compensating means such as a second diode or a bias current switching circuit are required. The only temperature-stability requirement for the components of detector 14 is that the resistances R1 and R2 should change in more or less the same way as the temperature varies; i.e., their temperature coefficients should be approximately the same.

To better understand how the selection of various values for R1, R2, and $V_{dd}$ affects the variation in voltage drop V as well as the detector output voltage $V_{det}$, and to appreciate just how similar the temperature coefficients of resistances R1 and R2 must be, consider that the detector output voltage $V_{det}$ is given by:

$$V_{det} = [V_{dd} - V] \frac{R2}{R2 + R1},$$

so the differential change in $V_{det}$ with temperature, t, is $$\frac{dV_{det}}{dt} = \frac{d}{dt}\left[V_{dd}\frac{R2}{R2 + R1}\right] - \frac{d}{dt}\left[V\frac{R2}{R2 + R1}\right].$$

Because R1>>R2, this can be rewritten as $$\frac{dV_{det}}{dt} = \frac{d}{dt}\left[V_{dd}\frac{R2}{R1}\right] - \frac{d}{dt}\left[V\frac{R2}{R1}\right].$$

and since $V_{dd}$ is constant, $$\frac{dV_{det}}{dt} = V_{dd}\left[\frac{R1\frac{dR2}{dt} - R2\frac{dR1}{dt}}{R1^2}\right] - V\frac{d}{dt}\left[\frac{R2}{R1}\right] - \frac{R2}{R1}\left[\frac{dV}{dt}\right].$$

which can be rewritten as $$\frac{dV_{det}}{dt} = [V_{dd} - V]\left[\frac{R1\frac{dR2}{dt} - R2\frac{dR1}{dt}}{R1^2}\right] - \frac{R2}{R1}\left[\frac{dV}{dt}\right].$$

To simplify, let:

$$\alpha = \left[\frac{R1\frac{dR2}{dt} - R2\frac{dR1}{dt}}{R1^2}\right],$$

so that $$\frac{dV_{det}}{dt} = [V_{dd} - V]\alpha - \frac{R2}{R1}\left[\frac{dV}{dt}\right].$$

However, a further simplification is possible if $\alpha$ is rewritten as $$\alpha = \frac{R2}{R1}\left[\frac{1}{R2}\frac{dR2}{dt} - \frac{1}{R1}\frac{dR1}{dt}\right],$$

making it easier to realize the dependency on $$\frac{1}{R2}\frac{dR2}{dt}$$

and $$\frac{1}{R1}\frac{dR1}{dt},$$

which are the temperature coefficients of resistances R2 and R1, respectively. Typically, the resistors 22 and 24 can be chosen such that these temperature coefficients are as small as 200 parts per million per °C. If R1 and R2 have approximately the same temperature coefficient, that is, if the difference in their temperature coefficients is on the order of a few parts per million per °C., then $\alpha$ can be considered to be equal to zero. Thus, an equation accurately defining the variation in detector output voltage with respect to temperature is simply $$\frac{dV_{det}}{dt} = -\frac{R2}{R1}\left[\frac{dV}{dt}\right].$$

This clearly indicates that the change in the detector output signal with respect to temperature is modified by the ratio R2/R1, so that if R1>>R2, then $dV_{det}/dt$ can be made arbitrarily small.

The dynamic range of the detector circuit 14 can be increased by simply choosing a detector diode 20 having a larger reverse breakdown voltage.

An RF bypass capacitor 26 may also be included at the output of the detector 14 to filter any RF energy superimposed on the diode 20.

Another DC bypass capacitor 28 is preferably used to filter the bias voltage $V_{dd}$ from switching transients caused by other circuit components, especially if $V_{dd}$ also serves as the supply voltage for other active components in the circuit such as the comparator 16 and D/A converter 19.

An impedance matching circuit 30 may also be disposed between the output terminal of the directional coupler 13 and the detector diode 20. The matching circuit 30 matches the impedance of the detector diode 20 and the output impedance of the directional coupler 13. The embodiment shown is a $\pi$-type network consisting of a first capacitor 31, a resistor 32, an inductor 33, and a second capacitor 34. The first capacitor 31 receives the output signal, $E_0$, from the directional coupler 13 at one terminal, and is connected to the second capacitor 34 at a common node 35. The other terminal of the second capacitor provides the detector input signal, $V_{sig}$. The resistor 32 and inductor 33 are connected in parallel and shunted between the common node 35 and the ground reference.

With a bias voltage $V_{dd}$ of 8 volts regulated to ±5%, the following nominal component values provide the above-reported five times reduction in temperature dependency of the detector output voltage, while matching a diode input impedance of 1 kilo-ohm (k$\Omega$) and a directional coupler impedance of 50 $\Omega$:
resistor 22 (R1) 274 k$\Omega$
resistor 24 (R2) 47.5 k$\Omega$
capacitor 26 1000 pico-farad (pF)
capacitor 28 1000 pF
capacitor 31 1 pF
resistor 32 680 $\Omega$
inductor 33 10 nano-Henries (nH)

capacitor 34 4.7 pF

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A controlled-output radio-frequency (RF) amplifier circuit wherein the output power level can be maintained at a number of predetermined levels over a range of operating temperatures, the amplifier circuit receiving an input RF signal and providing an output RF signal, the amplifier circuit comprising:
    A. an RF amplifier stage having an input connected to receive the input RF signal, an output connected to provide the output RF signal, and a gain control input;
    B. a power level detector responsive to the output RF signal, and connected to provide a gain control signal to the gain control input of the amplifier stage, the power level detector further comprising:
        i. a detector diode, having an anode connected to be responsive to the output RF signal, and a cathode connected to provide the gain control signal;
        ii. means for providing a bias voltage and a ground reference voltage; and
        iii. voltage divider means, connected to the detector diode, the voltage divider means comprising:
            a. a first resistor, connected between the bias voltage and the anode of the diode; and
            b. a second resistor, connected between the cathode of the diode and the ground reference voltage, with the second resistor having a resistance much less than the first resistor.

2. An amplifier circuit as in claim 1 additionally comprising:
    c. means for regulating the bias voltage to within five percent of its nominal value over the range of operating temperatures.

3. An amplifier circuit as in claim 1 wherein the first and second resistors have the similar temperature coefficients.

4. An amplifier circuit as in claim 1 wherein the rate of change with temperature in a detector output voltage provided by the diode is reduced by the ratio of the resistances of the first and second resistors.

5. An amplifier circuit as in claim 1 wherein additional amplifier stages are cascaded before the RF amplifier stage.

6. An amplifier circuit as in claim 1 wherein additional amplifier stages are cascaded after the RF amplifier stage.

7. An amplifier circuit as in claim 1 wherein the power level detector additionally comprises:
    iv. impedance matching means, connected between the RF amplifier stage output terminal and the anode of the diode.

8. An amplifier circuit as in claim 1 additionally comprising:
    C. means for selecting one of a plurality of reference signals;
    D. means for comparing the detector output signal to the selected reference signal, and for adjusting the gain control signal in response thereto.

9. A controlled-output radio-frequency (RF) amplifier circuit wherein the output power level can be maintained at one of a number of predetermined output power levels over a range of operating temperatures, the amplifier circuit receiving an input RF signal and providing an output RF signal, the amplifier circuit comprising:
    A. an RF amplifier stage having an input connected to receive the input RF signal, an output connected to provide the output RF signal, and a gain control input;
    B. means, connected to receive the output RF signal, for providing a sample of the RF output signal;
    C. a detector diode, having an anode connected to receive the sample of the output RF signal, and a cathode connected to provide a detector output signal;
    D. means for providing a direct current bias voltage and a ground reference voltage;
    E. a first resistor, connected between the direct current bias voltage and the anode of the diode;
    F. a second resistor, connected between the cathode of the diode and the ground reference voltage, with the resistance of the second resistor being much less than the resistance of the first resistor;
    G. means for providing a reference voltage indicative of one of the predetermined output power levels;
    H. a comparator, connected to receive the reference voltage and the detector output signal, and to provide an error voltage indicative of their difference; and
    I. means for receiving the error voltage and providing a gain control signal to the gain control input of the RF amplifier stage in response thereto.

10. An amplifier circuit as in claim 9 wherein the rate of change in the detector output voltage with respect to temperature is reduced by the ratio of the resistances of the first and second resistors.

11. A controlled-output amplifier having an input and an output, said input for receiving an input signal, said output for producing an output signal having a substantially constant predetermined magnitude, said amplifier comprising:
    controllable-gain amplifier means having first and second inputs and an output, said first input adapted to receive said input signal, said second input adapted to receive gain control signal, said output providing the output signal of said controlled-output amplifier;
    rectifier means having an input and an output, said input coupled to the output of said controllable-gain amplifier means, said rectifier means producing at said output a signal indicative of the magnitude of the output signal of said controlled-output amplifier;
    linear voltage dividing means, coupled to the input and output of said rectifier means, for providing a bias voltage and for linearly voltage-dividing the bias voltage, and thereby reducing the range of voltages over which the rectifier means must operate, the linear voltage dividing means including a first and second resistor, with the first resistor connected between the input of the rectifier means and the bias voltage, and the second resistor connected between the output of the rectifier means and a ground reference voltage, with the resistance of the second resistor being much less than the resistance of the first resistor;

comparison means having first and second inputs and an output, said first input coupled to the output of said rectifier means, said second input adapted to receive a reference signal, said comparison means providing a signal at said output which is indicative of the difference in magnitude of the reference signal and the signal produced at the output of said rectifier means; and control signal generator means having an input and an output, said input coupled to the output of said comparison means, said output coupled to the second input of the controllable-gain amplifier means, said generator means producing the gain control signal in response to the signal produced at the output of the comparison means, whereby the gain of the controllable-gain amplifier means is adjusted so as to maintain the output signal of the controlled-output amplifier at the predetermined magnitude.

12. Circuitry for controlling the magnitude of a radio frequency (RF) signal in response to control signals, comprising:

means, having variable output, for amplifying the RF signal to an output magnitude and for obtaining a sample of said amplified RF signal;

means, coupled to said means for amplifying-and-obtaining-a-sample, for linearly voltage-dividing said sample of said amplified RF signal;

means for rectifying said voltage-divided sample to generate a power magnitude signal having a magnitude related to said RF signal output magnitude;

means, for adjusting said power magnitude signal by an adjustment factor selected by the control signals;

means, responsive to said adjusted power magnitude signal, for varying said variable output amplifying means to produce a corresponding RF signal output magnitude; and wherein said means for linearly voltage-dividing further includes a first and second resistor, with the first resistor connected between the means-for-obtaining-a-sample and a bias voltage, and the second resistor connected between an output of the means for rectifying and a ground reference voltage, with the resistance of the second resistor being much less than that of the first resistor.

13. Control circuitry for maintaining the magnitude of a radio frequency (RF) signal from an RF signal amplifier at one of a plurality of levels selected by level control signals from a signal source, said control circuitry comprising:

means coupled to the RF signal amplifier for generating an output power signal having a magnitude that is related to the magnitude of the RF signal from the RF signal amplifier;

means coupled to the generating means for linearly voltage dividing the output power signal;

means coupled to the level control signals for adjusting the output power signal by an adjustment factor selected in response to the level control signals; and wherein said means for linearly voltage dividing further includes a first and second resistor, with the first resistor connected between the generating means and a bias voltage, and the second resistor connected between an output of the generating means and a ground reference voltage, with the resistance of the second resistor being much less than that of the first resistor.

* * * * *